US012599988B2

(12) United States Patent
Glavin et al.

(10) Patent No.: US 12,599,988 B2
(45) Date of Patent: *Apr. 14, 2026

(54) PROCESS OF MAKING COMPONENTS FOR ELECTRONIC AND OPTICAL DEVICES USING LASER PROCESSING

(71) Applicant: Government of the United States, as represented by the Secretary of the Air Force, Wright-Patterson AFB, OH (US)

(72) Inventors: Nicholas R. Glavin, Springboro, OH (US); Philip R. Buskohl, Beavercreek, OH (US); Kimberly A. Gliebe, Mentor, OH (US); Christopher Muratore, Kettering, OH (US); Drake Austin, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 1193 days.

This patent is subject to a terminal disclaimer.

(21) Appl. No.: 17/216,729

(22) Filed: Mar. 30, 2021

(65) Prior Publication Data

US 2021/0299781 A1     Sep. 30, 2021

Related U.S. Application Data

(60) Provisional application No. 63/001,604, filed on Mar. 30, 2020.

(51) Int. Cl.
B23K 26/00 (2014.01)
H01L 21/02 (2006.01)
(Continued)

(52) U.S. Cl.
CPC .... *B23K 26/0006* (2013.01); *H01L 21/02675* (2013.01); *H01L 21/324* (2013.01); *H01L 21/428* (2013.01)

(58) Field of Classification Search
CPC ........... B23K 26/1224; B23K 26/0006; B23K 26/123; B23K 26/125; H01L 21/02675;
(Continued)

(56) References Cited

U.S. PATENT DOCUMENTS 3,138,743 A     6/1964  Kilby
5,515,241 A     5/1996  Werther
(Continued)

OTHER PUBLICATIONS

"Mine, H. et al., Laser-Beam-Patterned Topological Insulating States on Thin Semiconducting MoS2," Oct. 2, 2019, American Physical Society, vol. 123, p. 146803 (Year: 2019).*
(Continued)

*Primary Examiner* — Yara B Green
*Assistant Examiner* — Erika H Son
(74) *Attorney, Agent, or Firm* — AFMCLO/JAZ; Jeffrey V. Bamber; James F. McBride

(57) ABSTRACT

The present invention relates to processes of making components for electronic and optical devices using laser processing and devices comprising such components. Such process uses a laser to introduce chemical and/or structural changes in substrates and films that are the raw materials from which components for electronic and optical devices are made. Such process yields components that can have one or more electronic and/or optical functionalities that are integrated on the same substrate or film. In addition, such process does not require large-scale clean rooms and is easily configurable. Thus, rapid device prototyping, design change and evolution in the lab and on the production side is realized.

18 Claims, 3 Drawing Sheets

(51) Int. Cl.
  *H01L 21/324*   (2006.01)
  *H01L 21/428*   (2006.01)
(58) Field of Classification Search
  CPC ......... H01L 21/02683; H01L 21/02686; H01L
     21/02691; H01L 21/02697; H01L 21/324;
      H01L 21/3242; H01L 21/3245; H01L
       21/02354; H01L 21/02356; H01L
       21/02565; H01L 21/02568; H01L
       21/02592; H01L 21/02595; H01L
     21/02598; H01L 21/428; H01L 21/477
  See application file for complete search history.

(56) References Cited

U.S. PATENT DOCUMENTS

| | | | |
|---|---|---|---|
| 5,526,280 | A | 6/1996 | Consadori et al. |
| 10,429,381 | B2 | 10/2019 | Hoffman |
| 10,770,483 | B2 * | 9/2020 | Sugawara ........... H01L 29/7869 |
| 10,875,339 | B1 | 12/2020 | Claussen |
| 11,469,351 | B2 * | 10/2022 | Li ........................... H01L 31/06 |
| 12,123,845 | B2 | 10/2024 | Mahjouri-Samani |
| 2006/0246632 | A1 | 11/2006 | Okumura |
| 2012/0043546 | A1 | 2/2012 | Oh |
| 2018/0308692 | A1 | 10/2018 | Muratore |
| 2020/0090933 | A1 | 3/2020 | Muratore |
| 2021/0299789 | A1 | 9/2021 | Glavin et al. |
| 2021/0301381 | A1 | 9/2021 | Glavin et al. |
| 2021/0313188 | A1 | 10/2021 | Glavin et al. |
| 2021/0325380 | A1 | 10/2021 | Muthukumar |
| 2022/0140147 | A1 | 5/2022 | Choe |
| 2022/0270891 | A1 | 8/2022 | Currie |
| 2023/0045818 | A1 | 2/2023 | Glavin et al. |
| 2023/0148461 | A9 | 5/2023 | Glavin et al. |
| 2023/0152309 | A9 | 5/2023 | Glavin et al. |

OTHER PUBLICATIONS

"Tan, Y. et al., Controllable 2H-to-1T Phase Transition in Few-Layer MoTe2," Oct. 10, 2018, Royal Society of Chemistry, 10, pp. 19964-19970 (Year: 2018).*
Mcconny, M.E. et al.; "Direct synthesis of ultra-thin large area transition metal dichalcogenides and their heterostructures on stretchable polymer surfaces," J. of Mat. Res., 2016, 0, 0, 1-8.
Sirota, B. et al. "Room temperature magnetron sputtering and laser annealing of ultrathin MoS2 for flexible transistors," Vacuum, 2019, 160, 133-138.
Kim, R. H. et al.; "Photonic Crystallization of MoS2 for Stretchable Photodetectors," Nanoscale, Nov. 2019, 13260-13268.
Galvin, N. R.; IEEE Presentation Rapid Conference in Miramar Beach, FL. Aug. 20, 2019, 1-44.
Ahmadi, Z. et al "Self-limiting laser crystallization and direct writing of 2D materials" Int. J. Extrem. Manuf. Jan. 2019, 015001, 1-8.
Vilá, R. A. . . . et al."In situ crystallization kinetics of two-dimensional MoS2" 2D Mater. May 2018, 5, 011009, 1-8.
Muratore, C. "Biofunctionalized Two-dimensional MoS2 Receptors for Rapid Response Modular Electronic SARS-CoV-2 and Influenza A Antigen Sensors" medrxivorg., Nov. 20, 2020, 1-11.
Muratore, C. "Beyond point of care diagnostics: Lowdimensional nanomaterials for electronic virus sensing" J. Vac. Sci. Technol. A 2020, 38, 050804, 1-16.
Austin Drake et al: "Laser writing of electronic circuitry in thin film molybdenum disulfide: A transformative manufacturing approach", Materials Today 2020, 43, pp. 17-26.
Yi Rang Lim et al: "Roll-to-Roll Production of Layer-Controlled Molybdenum Disulfide: A Platform for 2D Semiconductor-Based Industrial Applications", Advanced Materials, 2018, 30,1705270, pp. 1-8.
Rai Rachel H et al: "Pulsed laser annealing of amorphous two-dimensional transition metal dichalcogenides" J. Vac. Sci. Technol. 2020, A 38, 052201, pp. 1-7.

PCT International Search Report for PCT/US22/20850.
PCT Written Opinion of The International Searching Authority for PCT/US22/20850.
U.S. Appl. No. 17/216,729, filed Nov. 25, 2024 Non-final Rejection.
Mine, H.; Kobayashi, A.; Nakamura, T.; Inoue, T.; Pakdel, S.; Marian, D.; Gonzalez-Marin, E.; Maruyama, S.; Katsumoto, S.; Fortunelli, A.; Palacios, J.J.; Haruyama, J.; Laser-Beam-Patterned Topological Insulating States on Thin Semiconducting MoS2 2019, Physical Review Letters 123, 146803.
Tan, Y.; Luo, F.; Zhu, M.; Xu, X.; Ye, Y.; Li, B.; Wang, G.; Luo, W.; Zheng, X.; Wu, N.; Yu, Y.; Qin, S.; Zhang, X.; Controllable 2H-to-1T phase transition in few-layer MoTe2 Nanoscale Oct. 2018, 19964-19971.
PCT International Search Report for PCT/US22/20851.
PCT Written Opinion of The International Searching Authority for PCT/US22/20851.
PCT International Search Report for PCT/US22/20853.
PCT Written Opinion of The International Searching Authority for PCT/US22/20853.
PCT International Search Report for PCT/US22/20854.
PCT Written Opinion of The International Searching Authority for PCT/US22/20854.
Castellanos-Gomez et al. ("Laser-thinning of MoS2: On-Demand Generation of a Single-Layer Semiconductor." Nano Letters. vol. 12, No. 6, 3187-3192 (2012). DOI: 10.1021/nl301164v).
Kukkar et al. ("A New Electrolytic Synthesis Method for Few Layered MoS2 Nanosheets and Their Robust Biointerfacing With Reduced Antibodies." ACS Applied Materials & Interfaces, 8, 16555-16563 (2016). DOI: 10.1021/acsami.6b03079).
U.S. Appl. No. 17/336,855, filed Feb. 13, 2025 Non-final Rejection.
U.S. Appl. No. 17/336,799, filed Mar. 3, 2025 Non-final Rejection.
U.S. Appl. No. 17/216,729, filed Apr. 21, 2025 Final Rejection.
U.S. Appl. No. 17/336,799, filed Mar. 31, 2025 Non-final Rejection.
U.S. Appl. No. 17/523,705, filed Jun. 5, 2025 Non-final Rejection.
U.S. Appl. No. 17/523,721, filed Apr. 15, 2025 Non-final Rejection.
U.S. Appl. No. 17/957,293, filed Apr. 15, 2025 Non-final Rejection.
Supplemental information for Kukkar, et al. "A New Electrolytic Synthesis Method for Few Layered MoS2 Nanosheets and Their Reduced Antibodies", ACS Applied Materials & Interfaces, 8, 16555-16563 (2016). DOI: 10.1021/acsami.6b03079. (Year: 2016).
Zhang, et al. "Protocell arrays for simulatneous detection of diverse analytes", Nat Commun 12, 5724 (2001). DOE: 10.1038/s41467-021-25989-3. (Year: 2021).
Lee, et al. "Two-dimensional Layered MoS2 Biosensors Enable Highly Sensitive Detection of Biomolecules", Sci Rep 4, 7352 (2014). DOI: 10.1038/srep07352. (Year: 2014).
Windom, et al. "A Raman Spectroscopic Study of MoS2 and MoO3: Applications to Tribological Systems", Tribol Lett 42, 301-310 (2011). DOI: 10.1007/s11249-011-9774-x) (Year: 2011).
Lu, et al., "Layer-by-layer thinning of MoS2 by thermal annealing", Nanoscale 5, 8904-8908 (2013). DOI: 10.1039/c3nr03101b (Year: 2013).
Li, et al., "The Stability of Metallic MoS2 Nanosheets and Their Property Change by Annealing", Nanomaterials, 9, 1366 (2019). DOI: 10.3390/nano9101366. (Year: 2019).
Kang, et al., "High-performance MoS2 transistors with low-resistance molybdenum contacts", Applied Physics Letters 104, 093106 (2014). DOI: 10.1063/1.4866340. (Year: 2014).
U.S. Appl. No. 17/336,855, filed Sep. 12, 2025 Non-final Rejection.
U.S. Appl. No. 17/523,705, filed Oct. 31, 2025 Final Rejection.
U.S. Appl. No. 17/957,293, filed Nov. 28, 2025 Final Rejection.
Naylor et al. ("Scalable Production of Molybdenum Disulfide Based Biosensors." ACS Nano, 10(6), 6173-6179 (2016). DOI: 10.1021/acsnano.6b02137). (Year: 2016).
Rajeev et al. ("Laser patterned polymer/nanotube composite electrodes for nanowire transistors on flexible substrates." arXiv: Applied Physics (2017). DOI: 10.48550/arXiv.1711.06925). (Year: 2017).
Kang et al. ("Controllable atomic-ratio of CVD-grown MoS2-MoO2 hybrid catalyst by soft annealing for enhancing hydrogen evolution reaction." International Journal of Hydrogen Energy, 45, 1399-1408 (2020). DOI: 10.1016/j. ijhydene.2019.11.066). (Year: 2019).

(56) References Cited

OTHER PUBLICATIONS

Li et al. ("Fibroin-like Peptides Self-Assembling on Two-Dimensional Materials as a Molecular Scaffold for Potential Biosensing." ACS Applied Materials & Interfaces, 11, 20670-20677 (2019). DOI: 10.1021/acsami.9b04079). (Year: 2019).

Wells et al. ("Roll-to-Roll Deposition of Semiconducting 20 Nanoflake Films of Transition Metal Dichalcogenides for Optoelectronic Applications." ACS Appl. Nano Mater., 2, 7705-7712 (2019). DOI: 10.1021/acsanm.9b01774). (Year: 2019).

Park et al. ("Laser-directed synthesis of strain-induced crumpled MoS2 structure for enhanced triboelectrification toward haptic sensors." Nano Energy, 78, 105266 (2020). DOI: 10.1016/j.nanoen.2020.105266). (Year: 2020).

\* cited by examiner

PROCESS OF MAKING COMPONENTS FOR ELECTRONIC AND OPTICAL DEVICES USING LASER PROCESSING

CROSS-REFERENCE TO RELATED APPLICATION

The present application claims priority to U.S. Provisional Application Ser. No. 63/001,604 filed Mar. 30, 2020, the contents of which is hereby incorporated by reference in its entry.

RIGHTS OF THE GOVERNMENT

The invention described herein may be manufactured and used by or for the Government of the United States for all governmental purposes without the payment of any royalty.

FIELD OF THE INVENTION

The present invention relates to processes of making components for electronic and optical devices using laser processing and devices comprising such components.

BACKGROUND OF THE INVENTION

Device elements (e.g. resistors, capacitors, diodes, sensors, MOSFETs and bipolar junction transistors) within circuits rely on controlling the electron transport within three basic building blocks of electronic materials: insulators, conductors, and semiconductors. It is only through the precise and tedious integration of these three subsets of materials that we realize electronics, as we know them today. Current methods of making components for electronic and optical devices require large-scale clean rooms and are not easily reconfigurable. As a result, rapid device prototyping, design change and evolution is not only difficult in the lab but also prohibitive on the production side. As a result, industry has looked to additive manufacturing processes for a solution. Unfortunately, reproducibility, ink stability, and material limitations remain as barriers to an additive manufacturing solution. In addition to the aforementioned problems, current methods of making components for electronic and optical devices are limited to producing primarily single function components that are later assembled with other components to yield the desired electronic and/or optical functionality. Thus, what is needed is an efficient, easily reconfigurable process of making components for electronic and optical devices that not only can yield single function components but also can yield components with multiple functions that are integrated on the same substrate or film.

Applicants recognized that lasers could not only be used to remove material from substrates and films but could also be used to induce chemical and/or structural changes in substrates and films with distinct electronic properties. Such recognition lead Applicants to develop a process of making components for electronic and optical devices, devices that can have one or more electronic and/or optical functionalities. Importantly, Applicants process can be used to make structural and/or chemical changes within a film or other article that results in an electrical component, an optical component or a combined electrical and optical component being created in such film or article. Such process does not require large-scale clean rooms and is easily configurable. Thus, rapid device prototyping, design change and evolution in the lab and on the production side are realized.

SUMMARY OF THE INVENTION

The present invention relates to processes of making components for electronic and optical devices using laser processing and devices comprising such components. Such process uses a laser to introduce chemical and/or structural changes in substrates and films that are the raw materials from which components for electronic and optical devices are made. Such process yields components that can have one or more electronic and/or optical functionalities that are integrated on the same substrate or film. In addition, such process does not require large-scale clean rooms and is easily configurable. Thus, rapid device prototyping, design change and evolution in the lab and on the production side is realized.

Additional objects, advantages, and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF THE INVENTION

Definitions

Figure 1A:
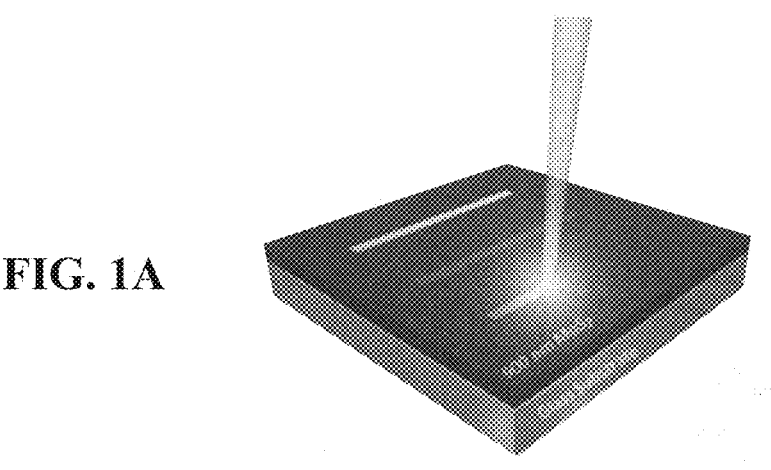
FIG. 1A is a schematic depicting a continuous wave laser beam forming patterned structures onto a 900 nm thick amorphous $MoS_2$ film on a glass substrate.

Unless specifically stated otherwise, as used herein, the terms "a", "an" and "the" mean "at least one".

As used herein, the terms "include", "includes" and "including" are meant to be non-limiting.

As used herein, the words "about," "approximately," or the like, when accompanying a numerical value, are to be construed as indicating a deviation as would be appreciated by one of ordinary skill in the art to operate satisfactorily for an intended purpose.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Processes of Making Components for Electronic and Optical Devices

For purposes of this specification, headings are not considered paragraphs and thus this paragraph is Paragraph 0022 of the present specification. The individual number of each paragraph above and below this paragraph can be determined by reference to this paragraph's number. In this Paragraph 0022, Applicants disclose process of making an electrical component, an optical component or a combined electrical and optical component, said process comprising:

a) pattern illumination-based annealing at a specific intensity and for a specific time, at least one material that comprises two or more regions that are amorphous, nanocrystalline, microcrystalline or crystalline with the proviso that at least two of said regions are not identical with respect being amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof, using a laser or lamp, to form on, within or on and within said material:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

said process being performed under one of the following conditions: vacuum of less 100 torr, air or under a fluid blanket other than air;

said pattern illumination-based annealing resulting in at least one of a chemical change or structural change in at least one of said materials that results in an electrical component, an optical component or a combined electrical and optical component being created to form on, within or on and within said material; or b) pattern illumination-based annealing at least one material that comprises at least one region that is amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof, using a laser or lamp, to form on, within or on and within said material:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

at least two electronic elements selected from a conductor, semiconductor and an insulator, said process being performed under one of the following environmental conditions: vacuum of less 100 torr, air or under a fluid blanket other than air, then repeating, one or more times said pattern illumination-based annealing on said at least one material using one or more of the following:

(i) the same device but at least one of the following: a different intensity or time;

(ii) a different environmental condition from the previous environmental condition, said different environmental condition select from the same group of environmental conditions; or (iii) a lamp if the previous pattern illumination-based annealing was laser pattern illumination-based annealing or a laser if the previous pattern illumination-based annealing was lamp pattern illumination-based annealing;

said pattern illumination-based annealing resulting in at least one of a chemical change or structural change in at least one of said materials that results in an electrical component, an optical component or a combined electrical and optical component being created to form on, within or on and within said material. In one aspect, said process is repeated up to a billion times Applicants disclose the process of Paragraph 0022 wherein for process 1b) said at least one material comprises two or more regions that are amorphous, nanocrystalline, microcrystalline or crystalline with the proviso that at least two of said regions are not identical with respect being amorphous, nanocrystalline, microcrystalline or crystalline, at least two of said regions being pattern illumination-based annealed via different pattern illumination-based annealing processes. Here, each such process is still within the scope of Paragraph 22's processing conditions.

Applicants disclose the process of Paragraphs 0022 through 0023 wherein, said transition metal is selected from the group consisting of molybdenum, tungsten, niobium, tantalum, vanadium, titanium, chromium, iron, rhodium, hafnium, rhenium and mixtures thereof.

Applicants disclose the process according to Paragraph 0022 through 0024, wherein said process is performed under a fluid blanket other than air.

Applicants disclose the process according to Paragraphs 0022 through 0025 wherein, said fluid blanket comprises:

a) an element selected from the group consisting of krypton, xenon, radon, argon, neon, helium, hydrogen, carbon, nitrogen, oxygen, sulfur, selenium, phosphorous and mixtures thereof;

b) based on total fluid volume greater than 0% to about 19% or from 21% to 100% oxygen; and/or c) greater than 0% to about 78% or from 80% to 100% nitrogen.

Applicants disclose the process according to Paragraphs 0022 through 0026 wherein, said material comprises at least one region that is amorphous or nanocrystalline.

Applicants disclose the process according to Paragraphs 0022 through 0027 wherein, said pattern illumination-based annealing is achieved by using a laser to subject said material for a time of about 1 femtosecond to 60 seconds, said laser having power of from about 1 W/cm$^2$ to about $1 \times 10^{15}$ W/cm$^2$ over said time of about 1 femtosecond to 60 seconds.

Applicants disclose the process of Paragraphs 0022 through 0027 wherein, said pattern illumination-based annealing is achieved by using a continuous wave laser to subject said material for a time of about 0.1 milliseconds to 60 seconds to said laser, said laser having power of from about 1 W/cm$^2$ to about $1 \times 10^8$ W/cm$^2$ over said time of about 0.1 milliseconds to 60 seconds.

Applicants disclose the process of Paragraphs 0022 through 0027 wherein, said pattern illumination-based annealing is achieved by using a continuous wave laser to subject said material for a time of about 1 femtosecond to 60 seconds to said laser, said laser having power of from about $1 \times 10^8$ W/cm$^2$ to about $1 \times 10^{16}$ W/cm$^2$ over said time of about 1 femtosecond to 60 seconds.

Applicants disclose the process of Paragraphs 0022 through 0030 wherein, said material comprises a film having a thickness of from about 0.1 nanometers to about 1 centimeter, preferably film has a thickness of from about 0.3 nanometers to about 10 micrometers Applicants disclose the process of Paragraphs 0022 through 0031 wherein, said electrical device, an optical device or a combined electrical and optical device is selected from the group consisting of an inductor, a capacitor, a resistor, a diode, a transistor, a trace, a battery, an optical filter, and a solar cell.

Applicants disclose process of making electrical device, an optical device or a combined electrical and optical device, said process comprising combining:

a) two or more electrical, an optical or a combined electrical and optical components produced according to a process of Paragraphs 0022 through 0031; or b) at least one electrical, optical or combined electrical and optical component produced according to a process Paragraphs 0022 through 0031, and one or more additional electrical, optical or combined electrical and optical components. Said one or more additional electrical, optical or combined electrical and optical components are not produced according to the processes of Paragraphs 0022 through 0031.

Applicants disclose an electrical device, an optical device or a combined electrical and optical device:

a) on, within or on and within at least one material that comprises two or more regions that are amorphous, nanocrystalline, microcrystalline or crystalline with the proviso that at least two of said regions are not identical with respect being amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof; or b) on, within or on and within at least one material that comprises at least one region that is amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof. Said electrical device, an optical device or a combined electrical and optical device being, in one aspect, produced according to the processes of Paragraphs 0022 through 0031.

Suitable amorphous, nanocrystalline, microcrystalline and/or crystalline materials comprising a transition metal and hydrogen, carbon, nitrogen, oxygen, sulfur, selenium, tellurium, and/or phosphorous can be obtained from Plasmaterials (2268 Research Drive, Livermore, CA 94550 USA) and Kurt Lesker (1925 Route 51, Jefferson Hills, PA 15025 USA.

Suitable lasers for conducting Applicants can be obtained from Thorlabs (56 Sparta Avenue, Newtown, NJ 07860 USA) and Coherent (5100 Patrick Henry Dr., Santa Clara, CA 95054 USA).

Devices Comprising Electronic and/or Optical Components

The components for electronic and optical devices that are made by Applicants' process can be used in a variety of electronic and optical devices. In general such electronic and optical devices are produced by incorporating one or more of the components made by Applicants' processes into the subject electronic and/or optical devices. Suitable ways of incorporating current components, made by processes other than Applicants' processes, are provided in U.S. Pat. No. 3,138,743 that relates to miniaturized electronic circuits, U.S. Pat. No. 5,515,241 that relates connecting integrated circuits and U.S. Pat. No. 5,526,280 that relates to a gas sensor circuit.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 1B:
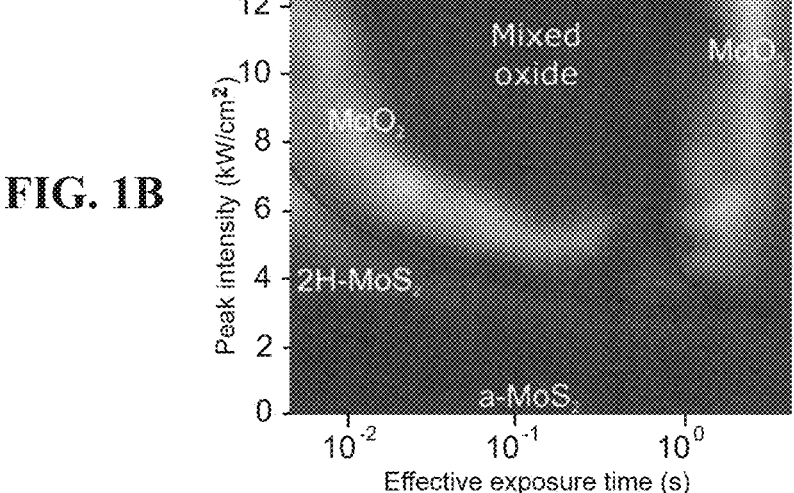
FIG. 1B is a processing diagram describing the chemistry and crystalline intensity of areas exposed to a given laser peak intensity ($kW/cm^2$) and effective exposure time.
Figure 1C:
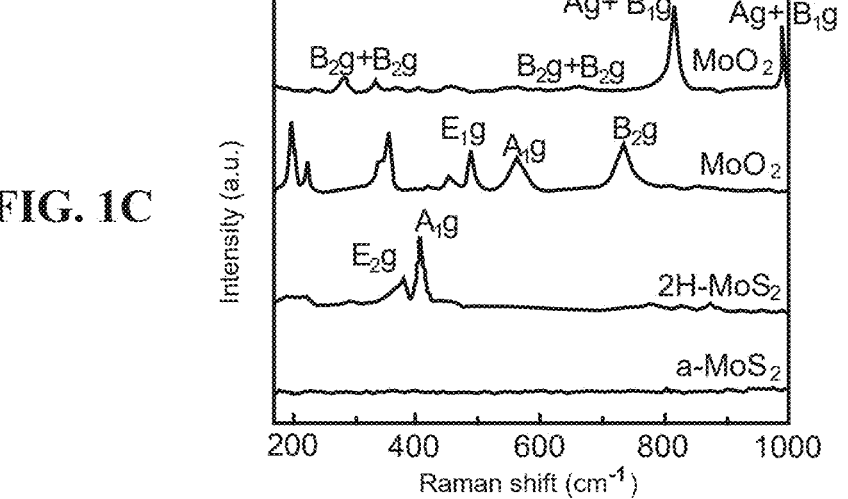
FIG. 1C are Raman spectrographs of the various crystalline films.

Example 1: Laser Written resistor and capacitor in thin film molybdenum disulfide. A molybdenum disulfide (MoS$_2$) thin film of thickness totaling $900 \pm 50$ nm was deposited onto a glass or SiO$_2$ wafer via magnetron sputtering using a 99.95% pure MoS$_2$ target. Deposition at room temperature resulted in an amorphous film (referred to as a-MoS$_2$) comprised of pure MoS$_2$ and little to no evidence of crystalline structure. Exposure of the a-MoS$_2$ to the laser intensities between 1 and 12 kW/cm$^2$ and exposure times between 0.01 and 10 seconds resulted in the formation of distinct chemical phases, schematically depicted in FIG. 1A. Specifically, the formation of crystalline 2H—MoS$_2$, MoO$_2$, and MoO$_3$ were observed. This is illustrated in FIG. 1B where the normalized Raman signal for distinct peaks associated with each phase are plotted as a function of intensity and exposure time. Each of the points in FIG. 1B correspond to the phase formed at the center of a line written under the specified conditions; further from the center, the intensity is lower and can result in the formation of a separate phase. With the ability to locally create crystalline MoS$_2$, MoO$_2$, and MoO$_3$, patterns utilizing the vastly different electronic properties enabled passive circuit elements to be created. One instance of this was through the direct laser writing of resistors and capacitors using a 514 nm laser and creating conducting MoO$_2$ patterns and insulating MoO$_3$ isolation.

Figures 2A, 2B:
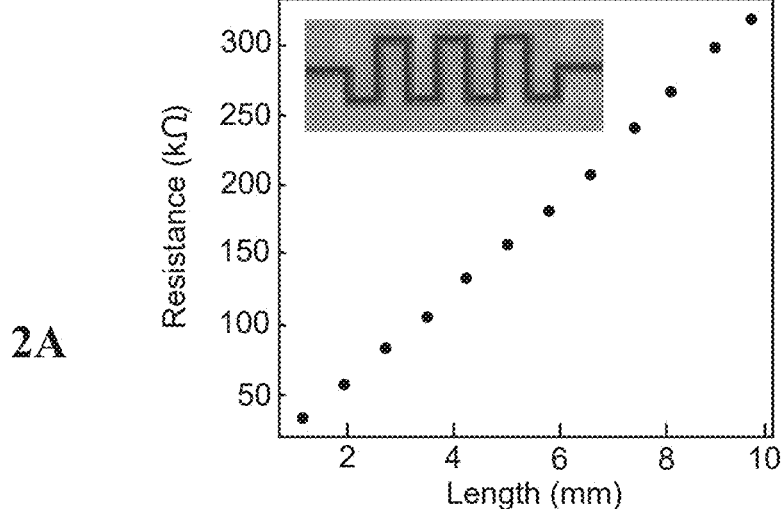
FIG. 2A depicts a laser written resistor and the change in resistance as the length of the line is increased.
FIG. 2B depicts a comb capacitor and the range in device capacitance achievable based on the capacitor length and design.

Depicted in FIG. 2A, resistance can be controlled in a resistor component by varying the length of conductive material within the amorphous material, with the required $MoO_3$ isolation surrounding. Additionally, comb capacitors shown in FIG. 2B with tailored electronic properties are possible via patterning of the same materials but in different configurations.

Figure 3A:
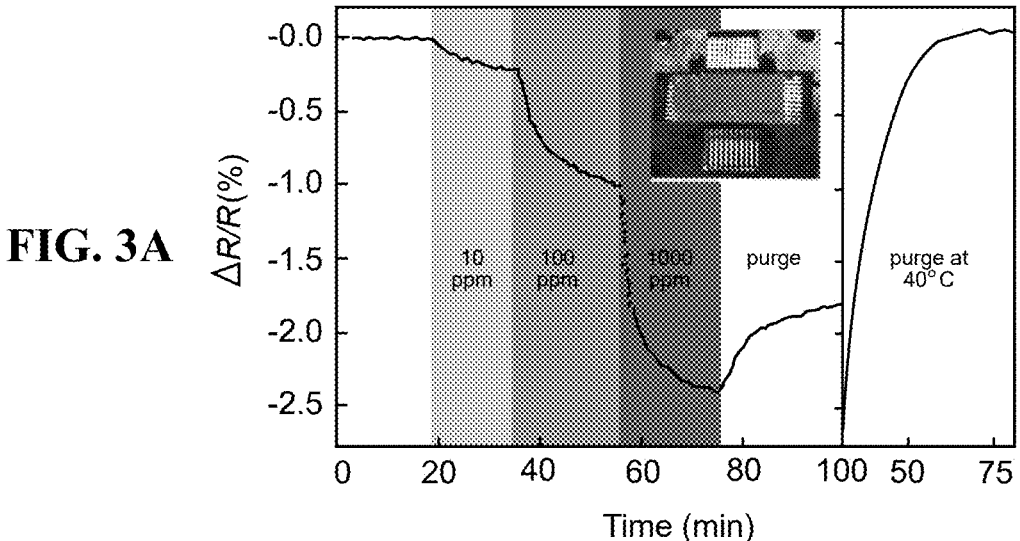
FIG. 3A shows a response from a laser written gas sensor with the inset being an image of the sensor under test.
Figure 3B:
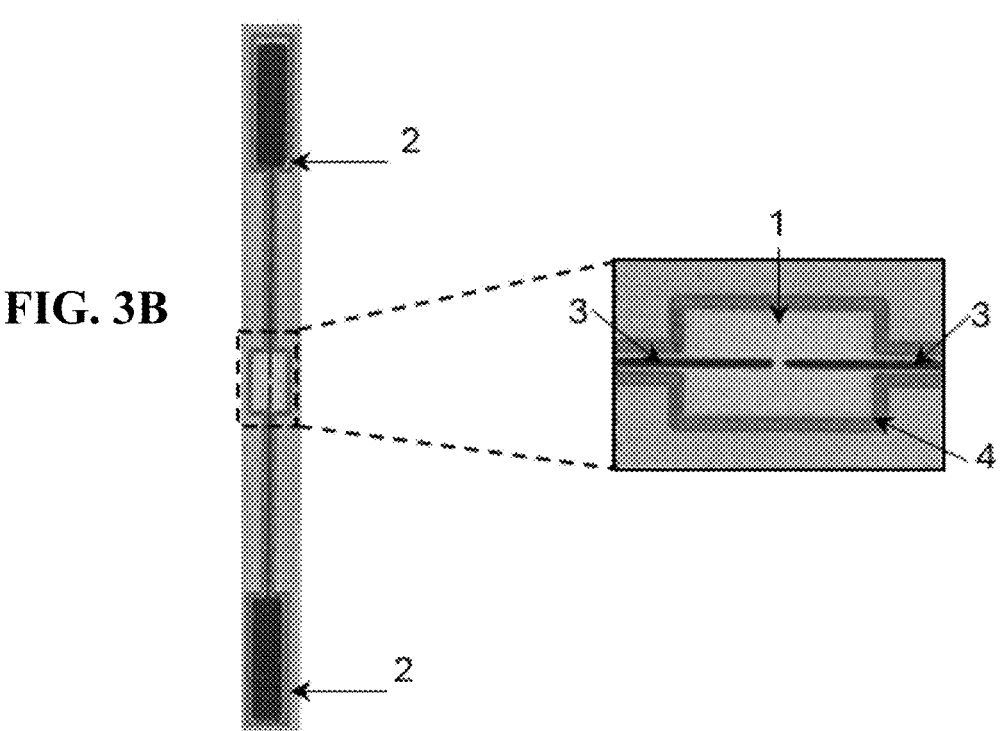
FIG. 3B is an optical image of the laser written sensor, with semiconducting crystalline $MoS_2$ channel (1), $MoO_2$ contact pads (2) and electrodes (3), and a $MoO_3$ boundary isolation (4).

Example 2: Gas sensor laser written in molybdenum disulfide Active circuit elements were also possible using the laser writing technique by taking advantage of the on/off properties of semiconducting $2H-MoS_2$. One example of this is the laser writing of a chemresistor style gas sensor shown in FIG. 3A and FIG. 3B that can detect ammonia at sub 10 ppm levels. This chemresistor was composed of a semiconducting crystalline $MoS_2$ channel, $MoO_2$ contact pads and electrodes, and a $MoO_3$ boundary isolation, such elements being labeled in FIG. 3B as semiconducting crystalline $MoS_2$ channel (1), $MoO_2$ contact pads (2) and electrodes (3), and a $MoO_3$ boundary isolation (4), and was demonstrated to detect 10, 100, and 1000 parts per million of $NH_3$ gas.

Example 3: The first five materials listed in Column 3 of Table 1 below were made in accordance with Applicants' process using a laser and then the same results were obtained using a lamp. Such materials are useful as listed in Column 5 of Table 1. The last 6 materials listed in Column 3 of Table 1 below are made in accordance with Applicants' process using a laser and then the same results were obtained using a lamp. Such materials are useful as listed in Column 5 of Table 1. The Examples 1, 2, 5, 9 and 10 show a crystalline structure changes in the starting material as represented by 2H, IT, T-Phase and H-Phase while Examples 3, 4, 6, 7, 8 and 9 show a chemical change in the starting material.

herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and process, and illustrative examples shown and described. Accordingly, departures may be made from such details without departing from the scope of the general inventive concept.

What is claimed is:

1. A process of making an electrical component, an optical component, or a combined electrical and optical component, said process comprising:

pattern illumination-based annealing at a intensity and for a time, at least one material that comprises, prior to said annealing, two or more regions that are amorphous, nanocrystalline, microcrystalline or crystalline with the proviso that at least two of said regions are not identical with respect being amorphous, nanocrystalline, microcrystalline or crystalline, said at least one material comprising a transition metal and an element selected from the group consisting of hydrogen, carbon, nitrogen, oxygen, sulfur, selenium, phosphorous and mix-

TABLE 1

| Starting Material | Fluid blanket | Methodology | Post-annealed material | Use |
|---|---|---|---|---|
| Amorphous | Vacuum | Crystallization | $2H-MOS_2$ | Semiconductor |
| $MoS_2$ | Vacuum | Crystallization | $IT-MoS_2$ | Conductor |
|  | Oxygen gas | Oxidation (Shorter annealing time) | $MoO_2$ | Conductor |
|  | Oxygen gas | Oxidation (longer annealing time) | $MoO_3$ | Insulator |
| Amorphous $WS_2$ | Vacuum | Crystallization | $2H-WS_2$ | Semiconductor |
| Amorphous TiS | Oxygen gas | Oxidation | TiO | Conductor |
|  | Oxygen gas | Oxidation | $TiO_2$ | Semiconductor |
|  | Nitrogen gas | Nitridization | TiN | Conductor |
| Amorphous $VS_2$ | Vacuum | Crystallization | T-phase $VS_2$ | Insulator |
|  | Vacuum | Crystallization | H-phase $VS_2$ | Semiconductor |
|  | Oxygen gas | Oxidation | $VO_2$ | Insulator |

Example 4. P-N junction with laser written MoS2/WSe2 Lateral P—N junctions are made possible through patterned amorphous deposition of in-plane heterjunctions of amorphous MoS2/WSe2 structures. With the use of one laser pass across the interface, a n-type semiconductor MoS2 is in contact with a p-type WSe2 semiconductor material, forming a P-N junction of use for light emitting diodes (LEDs) and other optical/electronic components.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed tures thereof, using a laser or lamp, to form on, within or on and within said material:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

said process being performed under one of the following conditions: vacuum of less than 100 torr, air, or under a fluid blanket other than air;

said pattern illumination-based annealing resulting in at least one of a chemical change or structural change in at least one of said materials that results in an electrical component, an optical component or a combined electrical and optical component being created to form on, within or on and within said material.

2. The process of claim 1 wherein said at least one material is a single material.

3. The process of claim 1 wherein said transition metal is selected from the group consisting of: molybdenum, tungsten, niobium, tantalum, vanadium, titanium, chromium, iron, rhodium, hafnium, rhenium, and mixtures thereof.

4. The process of claim 1 wherein said process is performed only under atmospheric air.

5. The process of claim 1 wherein said process is performed under a fluid blanket other than air, and said fluid blanket comprises:

a) an element selected from the group consisting of krypton, xenon, radon, argon, neon, helium, hydrogen, carbon, nitrogen, oxygen, sulfur, selenium, phosphorous and mixtures thereof;

b) based on total fluid volume greater than 0% to about 19% or from 21% to 100% oxygen; and/or c) greater than 0% to about 78% or from 80% to 100% nitrogen.

6. A process according to claim 1 wherein said two or more regions are nanocrystalline, microcrystalline, or crystalline.

7. A process according to claim 1 wherein said pattern illumination-based annealing is achieved by using a laser to subject said material for a time of about 1 femtosecond to 60 seconds, said laser having power of from about 1 $W/cm^2$ to about $1\times10^{15}$ $W/cm^2$ over said time of about 1 femtosecond to 60 seconds.

8. A process according to claim 1 wherein said pattern illumination-based annealing is achieved by using a continuous wave laser to subject said material for a time of about 0.1 milliseconds to 60 seconds to said laser, said laser having power of from about 1 $W/cm^2$ to about $1\times10^8$ $W/cm^2$ over said time of about 0.1 milliseconds to 60 seconds.

9. A process according to claim 1 wherein said pattern illumination-based annealing is achieved by using a continuous wave laser to subject said material for a time of about 1 femtosecond to 60 seconds to said laser, said laser having power of from about $1\times10^8$ $W/cm^2$ to about $1\times10^{16}$ $W/cm^2$ over said time of about 1 femtosecond to 60 seconds.

10. The process of claim 1 wherein, said material comprises a film having a thickness of from about 0.1 nanometers to about 1 centimeter.

11. The process of claim 1 wherein, said material comprises a film having a thickness of from about 0.3 nanometers to about 10 micrometers.

12. The process of claim 1 wherein, said electrical and/or optical component is selected from the group consisting of an inductor, a capacitor, a resistor, a diode, a transistor, a trace, a battery, an optical filter, and a solar cell.

13. A process of making electrical device, an optical device or a combined electrical and optical device, said process comprising combining:

a) two or more electrical, an optical or a combined electrical and optical components produced according to the process of claim 1; or b) at least one electrical, optical or combined electrical and optical component produced according to the process of claim 1, and one or more additional electrical, optical or combined electrical and optical components, said one or more additional electrical, optical or combined electrical and optical components are not produced according to the processes of claim 1.

14. An electrical device, an optical device or a combined electrical and optical device:

a) on, within or on and within at least one material that comprises two or more regions that are amorphous, nanocrystalline, microcrystalline or crystalline with the proviso that at least two of said regions are not identical with respect being amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof; or b) on, within or on and within at least one material that comprises at least one region that is amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof;

said electrical device, an optical device or a combined electrical and optical device being produced according to the process of claim 1.

15. The process of claim 1 wherein said pattern illumination-based annealing results in a chemical change in at least one of said materials that results in an electrical component, an optical component or a combined electrical and optical component being created to form on, or within said material.

16. The process of claim 2 wherein said single material is a single substrate or film, and said process provides multiple functions that are integrated on, within, or on and within said single substrate or film.

17. The process of claim 1 wherein said pattern illumination-based annealing results in a change in the molecular composition in a region of at least one of said materials that results in an electrical component, an optical component or a combined electrical and optical component being formed on, within or on and within said material.

18. The process of claim 17 wherein the transition metal is Mo, and the element is oxygen, and the process forms different oxide phases $MoO_2$ and $MoO_3$ on, within, or on and within said material.

* * * * *